United States Patent [19]

Redpath et al.

[11] Patent Number: 4,652,825
[45] Date of Patent: Mar. 24, 1987

[54] MAGNETIC COILS

[75] Inventors: Thomas W. T. Redpath; Robert D. Selbie; James M. S. Hutchison; Linda M. Eastwood, all of Aberdeen, Scotland; Glyn Johnson, London, England; John R. Mallard, Aberdeen, Scotland

[73] Assignee: National Research Development Corp., London, England

[21] Appl. No.: 638,647

[22] Filed: Aug. 7, 1984

[30] Foreign Application Priority Data

Aug. 8, 1983 [GB] United Kingdom ................ 8321295

[51] Int. Cl.$^4$ ........................................... G01R 33/20
[52] U.S. Cl. .................... 324/318; 324/300; 336/225
[58] Field of Search ............... 336/225; 324/318, 319, 324/300

[56] References Cited

U.S. PATENT DOCUMENTS

| 2,820,944 | 1/1958 | Bradley | 324/300 |
| 3,135,851 | 6/1964 | Hunter | 336/225 |
| 3,491,318 | 1/1970 | Henning et al. | 336/225 |

Primary Examiner—Michael J. Tokar
Assistant Examiner—Kevin D. O'Shea
Attorney, Agent, or Firm—Cushman, Darby & Cushman

[57] ABSTRACT

A magnetic coil, especially for use as an r.f. transmit/-receive coil in NMR apparatus, comprises a continuous closed conductive loop would round a former 1. A pair of external terminals 2 and 3 both lie in a plane 4 constituting a plane of symmetry and the coil is would so that there is mirror symmetry about this plane. There are two electrically parallel paths between terminals 2 and 3 each restricted to one side of the plane of symmetry 4 and the resultant magnetic field when a potential difference is applied between terminals 2 and 3 is such that equal magnetic fields are produced on both sides of the plane of symmetry 4.

8 Claims, 5 Drawing Figures

MAGNETIC COILS

This invention relates to magnetic coils and has application in coils designed for use as r.f. transmit and/or receive coils. One use for such coils is in NMR apparatus.

There is a requirement in NMR apparatus for r.f. coils which embrace an object being examined and carry the requisite r.f. currents required to generate an r.f. magnetic field in the object of appropriate frequency and thus produce gyromagnetic resonance. Likewise the gyromagnetic signals produced by free induction in nuclei in the object are detected by a suitable coil embracing the object. The same coil may act as both the transmit and receive coil, or else separate coils may be provided.

To minimise resistance an r.f. coil is constructed of as thick a conductor as feasible and since at high frequencies electric current tends to be limited to a region close to the surface of a conductor it is possible to utilise tubing instead of solid wire without impairing performance.

According to the invention a magnetic coil comprises a continuous closed conductive loop shaped to embrace a volume, at least one pair of external terminals in the loop, the terminals of a pair being positioned to provide two similar electrically parallel paths for current through the loop between the terminals and the shape of the loop being such that the loop has mirror symmetry about a plane bisecting the volume so that when a potential difference is applied between the terminals the resulting current flows produce equal magnetic fields on both side so the said plane.

Preferably the loop has a shape that there are mirror symmetries about two orthogonal planes each bisecting the volume. The volume may be cylindrical and the coil may be wound on a former shaped so that it can rest on a patient's neck thus allowing the throat and head of a patient to be examined by NMR techniques.

In one preferred arrangement two pairs of external terminals are provided the pairs of terminals being positioned so that when current flows between any one pairs of terminals there is no potential difference between the other pair of terminals.

In order that the invention may be more fully understood reference will now be made to the accompanying drawings in which.

Figure 1:
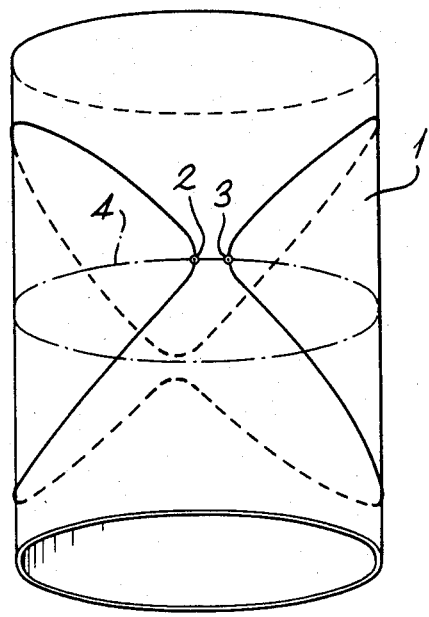
FIG. 1 shows in perspective an embodiment of the invention.

Referring now to FIG. 1 there is shown therein a cylindrical former 1 around which an r.f. coil is wound. A pair of external terminals 2 and 3 are positioned close to each other and both lie in a plane 4 normal to the axis of the cylinder. Plane 4 bisects former 1 and constitutes a plane of symmetry and the coil is wound so that there is mirror symmetry about this plane.

The coil provides two similar paths extending between terminals 2 and 3 and these paths are electrically in parallel. Each path is restricted to one side of the plane of symmetry 4 and the respective lines followed by the two paths are mirror images of each other.

It will be seen that if a potential difference is applied between terminals 2 and 3 equal currents will flow in each of the two parallel paths and the positions of the parts of the loop and the directions of the currents are such that equal magnetic fields are produced within the former on both sides of the plane of symmetry and the magnetic fields on both sides have axial components in the same direction which augment each other.

Figure 2:
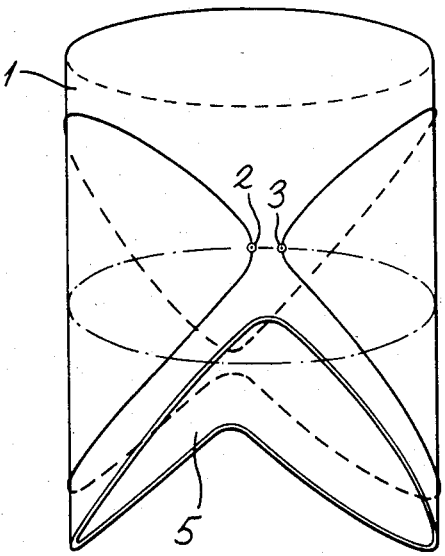
FIG. 2 shows the embodiment of FIG. 1 adapted to fit on a patient's shoulders.

The former shown in FIG. 1 can be shaped and adapted to fit over a patient's shoulder and such an arrangement in shown in FIG. 2 in which like parts have like reference numerals. The coil former 1 in FIG. 2 has one end 5 thereof cut out to enable the former to be positioned around the head and neck of a patient and rest on the patient's shoulders. Such a coil enables a better signal-to-noise ratio NMR signal to be obtained for neck and lower head images than could be obtained from a larger whole body coil. The symmetry of the coil imposes symmetry on the magnetic field that is produced by current flow through the coil so that at any point in the plane of symmetry 4 shown in FIG. 1 the field is at right angles to the plane. In an NMR application therefore the static magnetic field direction is typically chosen to lie in the plane of symmetry.

Figure 3:
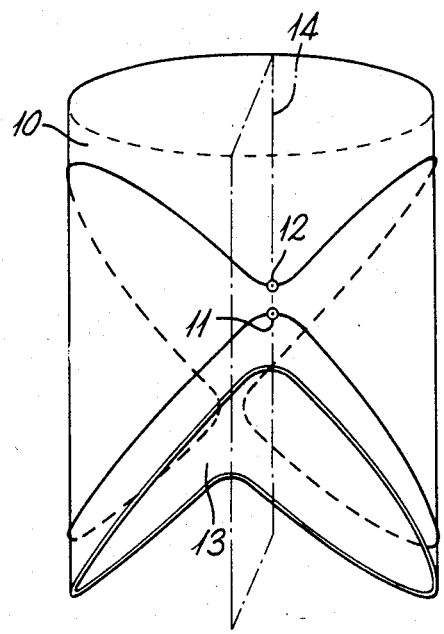
FIG. 3 shows in perspective an alternative embodiment to FIG. 1.

In the FIG. 1 and FIG. 2 arrangement the direction of the resultant magnetic field that is produced is axially of the cylindrical former. If desired the coil can be wound so that the resultant magnetic field has a direction which is orthogonal to the axis of the cylindrical former and such an arrangement is shown in FIG. 3. In FIG. 3 a coil in the form of a closed loop is wound around cylindrical former 10. The coil is wound so that there is a plane of symmetry 14 extending axially of former 10. Two external terminals 11 and 12 are provided on the coil. With this arrangement current flow through the coil between terminals 11 and 12 will result in a magnetic field either side of the plane of symmetry 14 extending in a resultant direction orthogonal to plane 14. Former 10 like former 1 in FIG. 1 and FIG. 2 has one end 13 shaped to enable the former to rest on the shoulders of a patient.

Figure 4:
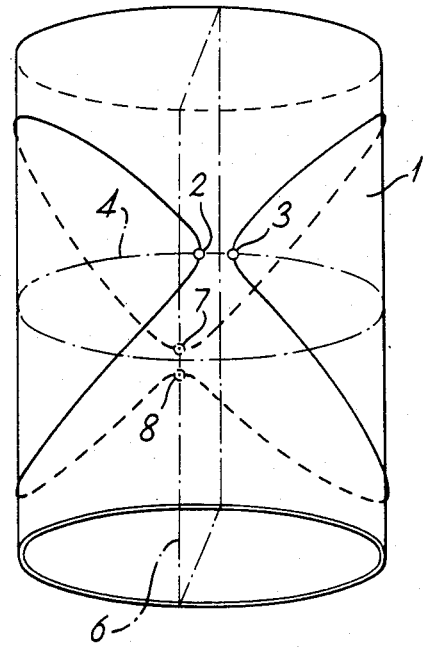
FIG. 4 shows in perspective the embodiment of FIG. 1 which can be used as a transmit/receive coil.

Another embodiment of the invention is shown in FIG. 4. In this arrangement in which the coil has a similar configuration to that shown in FIG. 1 and FIG. 2, and like parts have like reference numerals, two further external terminals 7 and 8 are provided. Terminals 7 and 8 are respectively located in each of the two parallel paths of the coil that extend between terminals 2 and 3. It will be appreciated that in addition to the mirror symmetry of the coil of FIG. 4 about the plane there is also mirror symmetry about a plane 6 which is orthogonal to plane 5 and lies along the axis of the cylindrical former. The symmetry of the coil gives it the important property that when a voltage is applied across one terminal pair there will be no resultant voltage between the second pair of terminals caused by the current flow through the two parallel paths between the first terminal pair. Thus r.f. power may be transmitted through one terminal pair, for example between terminals 2 and 3 and NMR signals received from the object through the second termnal pair 7 and 8. No part of the relatively large transmitting voltage applied across the terminals 2 and 3 will appear across the receiving terminals 7 and 8. Any electronic apparatus connected to the receiving terminals is therefore electrically isolated from the transmitting voltage.

The magnetic field at any point in the plane of symmetry 4 produced by r.f. currents resulting from the voltages applied between terminals 2 and 3 will be at right angles to the plane of symmetry 5. Similarly the magnetic field at any point in the plane of symmetry 6 is at right angles to the plane 6. Therefore for NMR applications the static magnetic field direction would typically be chosen to lie along the line of intersection of the two planes of symmetry.

Figure 5:
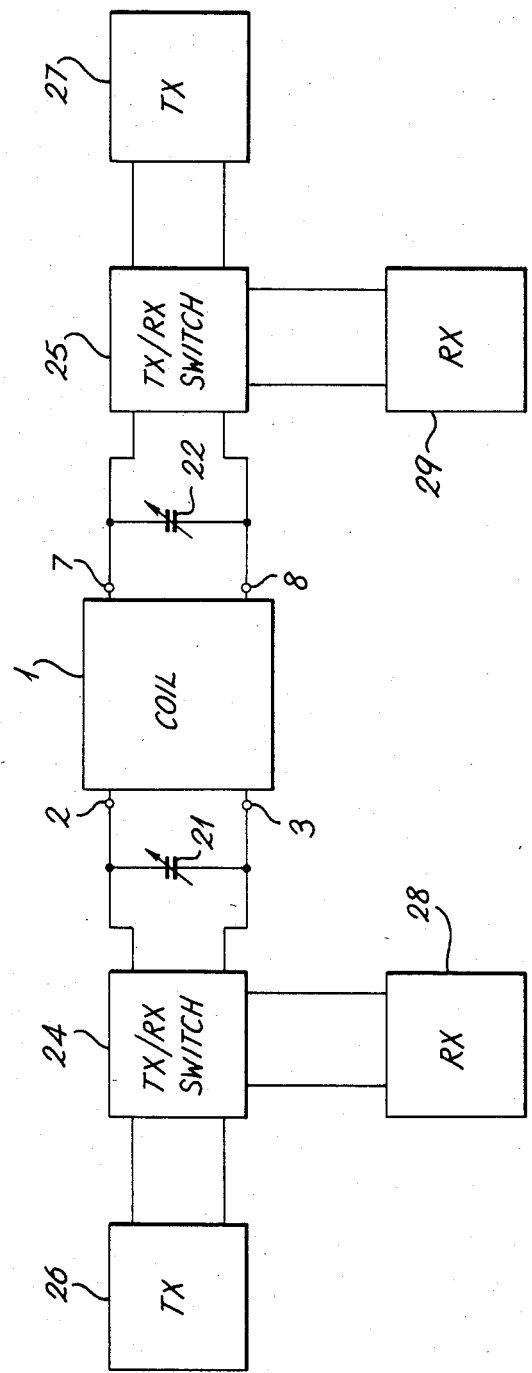
FIG. 5 shows a circuit diagram for apparatus embodying the coil of FIG. 4.

As an alternative to the arrangement of FIG. 4 being used as a transmit/receive coil it is possible to utilise the coil in the circuit shown in FIG. 5. In this circuit a coil 10 having two pairs of terminals 2, 3 and 7, 8 corresponding to the two pairs of terminals of the coil shown in FIG. 4 is shown. Respective tuning capacitors 21 and 22 are connected across the pairs of terminals and each pair of terminals is connected to individual transmit/receive switches 24 and 25. Transmit/receive switch 24 is supplied with the output from a transmitter 26 and can switch to a receiver 28. Likewise switch 25 is supplied with the output of a transmitter 17 and can switch the coil terminals to a receiver 19.

The capacitors are used to tune the two modes of the coil to different frequencies which can be chosen to correspond to the resonant frequencies of two different nuclear species. Thus in this application it is possible to allow simultaneous NMR experiments to be carried out on two different nuclear species in an object being examined using only one r.f. coil.

We claim:

1. NMR apparatus including:
    a magnetic coil comprising a continuous closed conductive loop shaped to embrace a volume, two pairs of external terminals in the loop, the pairs of terminals being positioned to provide two similar electrically parallel paths for current through the loop between the terminals of each pair and the shape of the loop being such that the loop has mirror symmetry about a plane bisecting the volume so that when a potential difference is applied between a pair of terminals the resultant current flows produce equal magnetic fields on both sides of the said plane, the pairs of terminals being positioned so that when current flows between any one pair of terminals there is not potential difference between the other pair of terminals;
    an r.f. signal transmitter connected across one of said pairs of external terminals; and
    an r.f. signal receiver connected across the other of said pairs of external terminals.

2. NMR apparatus as in claim 1 in which the loop has a shape such that there are mirror symmetries about two orthogonal planes each bisecting the volume.

3. NMR apparatus as in claim 1 in which the said volume is cylindrical.

4. NMR apparatus as in claim 3 and wound on a former shaped so that it can rest on a patient's neck.

5. NMR apparatus including:
    a magnetic coil comprising a continuous closed conductive loop shaped to embrace a volume, two pairs of external terminals in the loop, the pairs of terminals being positioned to provide two similar electrically parallel paths for current through the loop between the terminals of each pair and the shape of the loop being such that the loop has mirror symmetry about a plane bisecting the volume so that when a potential difference is applied between a pair of terminals the resultant current flows produce equal magnetic fields on both sides of the said plane, the pairs of terminals being positioned so that when current flows between any one pair of terminals there is no potential difference between the other pair of terminals;
    a first transmit/receiver switch connected to one of said pairs of external terminals;
    a second transmit/receiver switch connected to the other of said pairs of external terminals;
    a first r.f. signal transmitter and a first r.f. signal receiver connected to said first transmit/receiver switch; and
    a second r.f. signal transmitter and a second r.f. signal receiver connected to said second transmit/receiver switch.

6. NMR apparatus as in claim 5 in which the loop has a shape such that there are mirror symmetries about two orthogonal planes each bisecting the volume.

7. NMR apparatus as in claim 5 in which the said volume is cylindrical.

8. NMR apparatus as in claim 7 and wound on a former shaped so that it can rest on a patient's neck.

* * * * *